(12) United States Patent
Ceyssens et al.

(10) Patent No.: US 12,544,563 B2
(45) Date of Patent: Feb. 10, 2026

(54) FLEXIBLE NEURAL IMPLANT WITH IMPROVED INSERTION AND FIXATION CHARACTERISTICS

(71) Applicant: REVISION IMPLANT NV, Haasrode (BE)

(72) Inventors: Frederik Ceyssens, Haasrode (BE); Samara Frey, Leuven (BE)

(73) Assignee: REVISION IMPLANT NV, Haasrode (BE)

( * ) Notice: Subject to any disclaimer, the term of this patent is extended or adjusted under 35 U.S.C. 154(b) by 188 days.

(21) Appl. No.: 18/562,710

(22) PCT Filed: Jan. 11, 2022

(86) PCT No.: PCT/EP2022/050467
§ 371 (c)(1),
(2) Date: Nov. 20, 2023

(87) PCT Pub. No.: WO2022/242916
PCT Pub. Date: Nov. 24, 2022

(65) Prior Publication Data
US 2024/0226538 A1    Jul. 11, 2024

(30) Foreign Application Priority Data
May 21, 2021   (EP) .................................... 21175479

(51) Int. Cl.
*A61B 5/05*    (2021.01)
*A61B 5/00*    (2006.01)
(Continued)

(52) U.S. Cl.
CPC ............ *A61N 1/0531* (2013.01); *A61B 5/262* (2021.01); *A61B 5/685* (2013.01); *A61N 1/37514* (2017.08); *A61N 1/37518* (2017.08)

(58) Field of Classification Search
CPC .............. A61N 1/0531; A61N 1/37514; A61N 1/37518; A61N 1/0536; A61N 1/3605; A61N 1/3787
See application file for complete search history.

(56) References Cited

U.S. PATENT DOCUMENTS

| 10,214,001 B2 | 2/2019 | Shah et al. |
| 10,335,519 B2 | 7/2019 | Kaplan et al. |

(Continued)

FOREIGN PATENT DOCUMENTS

| CN | 109645991 A | 4/2019 |
| CN | 111053535 A | 4/2020 |

OTHER PUBLICATIONS

International Search Report from corresponding PCT Application No. PCT/EP2022/050467, Jun. 7, 2022.

(Continued)

*Primary Examiner* — Eugene T Wu
(74) *Attorney, Agent, or Firm* — Workman Nydegger

(57) ABSTRACT

A substantially planar neural electrode array includes a flexible base, a connector cable attached to the base, one or more flexible shafts protruding from the base. The shafts are arranged to protrude in the same plane from the same surface of the base to form a comb-like structure. Each of the one or more shafts includes one or more electrode contacts. The electrode contacts are electrically coupled to the connector cable. A first reinforcement layer extends over the base and a proximal part of the one or more shafts. The proximal part is adjacent to the base; a second resorbable reinforcement layer extends over a distal part of the one or more shafts. The distal part is distant from the base. There is an overlap between the first reinforcement layer and the second resorbable reinforcement layer.

15 Claims, 11 Drawing Sheets

(51) Int. Cl.
*A61B 5/262* (2021.01)
*A61N 1/05* (2006.01)
*A61N 1/375* (2006.01)

(56) References Cited

U.S. PATENT DOCUMENTS

2019/0313933 A1* 10/2019 Fang ..................... H05K 3/14
2021/0007808 A1    1/2021 Montague

OTHER PUBLICATIONS

Extended European Search Report from corresponding EP Application No. 21175479.1, Oct. 27, 2021.

* cited by examiner

FLEXIBLE NEURAL IMPLANT WITH IMPROVED INSERTION AND FIXATION CHARACTERISTICS

FIELD OF THE INVENTION

This invention relates to arrays of thin, flexible electrode arrays aimed at large scale (high resolution) neural signal recording and neurostimulation in brain or nerve tissue. More specifically, it relates to the insertion of multiple needle or comb-shaped arrays of such electrodes, thus forming a 3D array. It has features that allow for improved insertability and subsequent mechanical stabilization.

BACKGROUND ART

More and more evidence has been gathered that flexible neural electrode arrays are superior to harder and (typically) larger silicon or metal-based electrode arrays in terms of scar tissue formation and long-term performance. A possible reason is the reduction of the damage or irritation caused by the continuous movement of the implant with respect to the brain. Typically, such flexible electrode arrays are fabricated using thin-film technology on flat carrier substrates such as silicon wafers, after which they are released from the carrier. Common materials used for flexible electrode arrays are polyimide or Parylene-C isolation layers and noble metal electrical connection and electrode materials such as platinum, iridium oxide, carbon nanotubes or PEDOT. Typical shapes are needle-shapes, or arrays of needles, also called shafts or strands, originating from one or more common bases. The bases are intended to be placed outside of the neural tissue, while the electrode-containing needles are meant to penetrate inside.

To allow high-resolution interaction with a large volume of neural tissue, a 3D array of electrodes needs to be inserted. As by nature flexible electrode arrays are too weak to penetrate brain meninges or even brain tissue by themselves the need to temporarily reinforce the flexible neural electrode arrays during insertion (either by a coating or by external means such as an insertion shuttle) has been long established.

It is common not to insert the electrodes of the flexible array all at once, in order to avoid the so-called 'needle-bed effect' which drastically increases the required insertion force. Instead, piece-by-piece or row-by-row insertion is used.

Existing methods of inserting a 3D array of flexible needles or strands include the use of a hard insertion needle grasping of the electrode strands and inserting the strands one by one. This method is hard to scale up to large numbers of insertion points. One costly and complicated improvement to alleviate this is to use robot-assisted surgery to ease the long-time requirements, as disclosed for instance in US20210007808A1.

Another method uses hard (metal or silicon-based) insertion vehicles (or shuttles) to which the flexible, planar (2D) arrays are temporarily glued with a biocompatible, water-dissolvable substance such as polyethylene glycol. By using comb-shaped versions of such insertion vehicles, row-by-row insertion can be done which speeds up the implantation procedure considerably, as disclosed for instance in U.S. Ser. No. 10/214,001 B2.

However, in our work we have encountered several disadvantages of this method: (a) the method does not scale well to very thin flexible electrode arrays. Once the arrays become thinner than typically 10-20 microns the chance that the implant gets pulled out during retraction of the insertion vehicle increases, as it does have little remaining stiffness of its own. Furthermore, (b) after unintentional pull-out it is impossible to re-insert the implant as it is too weak to be inserted by itself and there is no way to re-attach the implant to the insertion vehicle during surgery and (c) the retracting motion of the insertion vehicle is a source of additional tissue damage.

Yet another method uses coating of flexible, planar 2D arrays with a dissolvable or bioresorbable reinforcing material such as polyethylene glycol, PGA, PLGA, dextran or sucrose. Such methods have demonstrated the ability to insert single strands of thin, flexible electrodes with little damage, leaving a scar much smaller in volume than the original volume occupied by the resorbable material as disclosed for instance in U.S. Ser. No. 10/335,519 B2.

But also for inserting larger arrays built up out of several combs or other shapes beyond simple, single needles, this could be the most straightforward method. It does not require complex manipulations while at the same time being useful to insert large 3D arrays by hand or with simple equipment. The impracticalities of the shuttle-based method mentioned above—no possibility to reinsert the implant, additional tissue damage through retraction of the shuttle—are inherently avoided.

When investigating the latter method, our experiments have revealed several weaknesses of the simple, straightforward coating techniques when these are applied to planar comb-shaped arrays; weaknesses that are not apparent when coating single needles. Without the application of a reinforcing coating, the base of a thin flexible implant is often not sufficiently stiff to be inserted. In addition, when the entire implant is coated using a traditional dip-coating technique, the coating tends to form a bridge between adjacent needles. Consequently, insertion of the implant into neural tissue would require much more force and cause far more tissue damage. An option is not to use the dip-coating technique. However, dip-coating yields sharp needle tips. Therefore, it would still be the preferred coating method if the bridging problem would be solved.

Furthermore, the planar electrode arrays inserted this way are only weakly adhering to the underlying tissue: they are supported only on their thin side plane, by the protruding shafts and by the connector. The arrays should be secured in place beyond just being let to float on the brain surface.

A sufficiently stiff and thick coating of the base of the array could help the electrode array to stay in place. However, when the base is coated in the same dissolvable or bioresorbable coating as the electrode needles, this reinforcement will disappear over time, often leading to dislodging of the implant.

Fourth, the bases of the planar arrays tend to undergo torsion forces from the cable that connects them to the electronic circuit needed to read out or control the electrodes. This tends to twist the bases downwards, pulling the attached needles out of the neural tissue.

Finally, it is difficult to connect the base of a thin flexible electrode array to a superstructure, that would allow for better fixation on the surface of the neural tissue.

Therefore, there is still a need for a flexible neural electrode array that has improved insertion and fixation characteristics.

SUMMARY

According to a first aspect of the invention, a substantially planar neural electrode array is disclosed, the electrode array comprising:

a flexible base;
a connector cable, attached to said base;
one or more flexible shafts protruding from the base, the shafts arranged to protrude in the same plane from the same surface of the base so as to form a comb-like structure, wherein each of the one or more shafts comprises one or more electrode contacts, the electrode contacts being electrically coupled to the connector cable;
characterized in that
a first reinforcement layer extends over the base and a proximal part of the one or more shafts, the proximal part being adjacent to the base;
a second, resorbable or dissolvable reinforcement layer extends over a distal part of the one or more shafts, the distal part being distant from the base;
wherein there is overlap between the first reinforcement layer and the second resorbable reinforcement layer.

Preferably, there is substantially no overlap between the second resorbable reinforcement layer and the base.

In the context of this disclosure, a "neural electrode array" is to be understood as a device that is implantable in neural tissue of a human or other mammal and is aimed at neural signal recording and/or neurostimulation of said tissue.

In the context of this disclosure, the adjective "flexible" implies that the electrode array has a stiffness that is substantially lower than the stiffness of current state-of-the-art silicon microneedle arrays for neural recording, such as the Utah array or the Neuropixel device. The skilled person understands that the stiffness of the electrode array is a function of both the array's geometry and of the elastic modulus of the materials out of which the array is made. While the electrode array is substantially made of a material that has a significantly lower—often by multiple orders of magnitude—elastic modulus than the metallic or ceramic materials that are typically employed in implants, the skilled person will understand that the elastic modulus of this material can still be higher—even by multiple orders of magnitude—than the elastic modulus of a human or other mammal's neural tissue. Thus, in the present invention, the electrode array mainly obtains its flexibility from its planar geometry and limited thickness in the out of plane direction. When compared to a more conventional neural electrode array that is made substantially out of silicon, the electrode array according to the present invention has a flexibility that is at least one order of magnitude larger.

In the context of this disclosure, the adjective "resorbable" or "bioresorbable" is to be understood as "that can be broken down and absorbed by the body of a living human or other mammal, after insertion into said body, leaving behind substantially no foreign material in said body and not causing a persistent inflammatory response in said body". The adjective "dissolvable" is to be understood as "that can be excreted by the body of a living human or other mammal, after insertion into said body, leaving behind substantially no foreign material in said body and not causing a persistent inflammatory response in said body". The skilled person is aware of such bioresorbable or dissolvable materials.

The electrode array according to the present invention is substantially planar, i.e. two of its dimensions are substantially larger than the third. The electrode array comprises a substantially planar base to which shafts, also called needles or strands are attached. These shafts all lay in substantially the same plane. The shafts lay in substantially the same plane as the electrode array's base. The shafts all protrude in the same direction from the same side of the electrode array's base. The electrode array thus has a comb-like structure, which is well known to the person skilled in the art.

The electrode array is primarily composed out of a flexible, bio-compatible and electrically insulating material. These materials, typically polymers such as polyimide or Parylene-C are well known to the person skilled in the art. Planar electrode arrays made from these materials are typically orders of magnitude more flexible than traditional metal or silicon-based electrode arrays. Internally, the electrode array comprises traces of an electrically conducting material. These traces connect electrode contacts on the shafts—places that are not covered by electrically insulating material—with a connector cable which connects to the base of the electrode array. The electrode array may comprise tens to hundreds of electrode contacts.

A first reinforcement layer extends over the base of the electrode array and the proximal part—the part connecting to the base—of the shafts of the electrode array. The first reinforcement layer does not necessarily cover the entire surface area of the base and the proximal part. The first reinforcement layer might cover the base and the proximal part of the needles only partially. The first reinforcement layer might extend over the base and proximal part partially or completely without completely covering the base and the proximal part: e. g. the first reinforcement layer might feature cut-outs. An example of a first reinforcement layer which extends over the entire base and proximal part without covering them entirely is a reinforcement layer in the form of a honeycomb structure. The first reinforcement layer does not necessarily have a uniform thickness over its entire extent.

The first reinforcement layer is made of biocompatible, electrically insulating material. Preferably, the material of the first reinforcement layer is not dissolvable in bodily fluids or aqueous solutions. Preferably, the material of the first reinforcement layer is not bioresorbable. Suitable materials for the first reinforcement layer are for instance ceramics or polymers like polyimide or Parylene-C or UV curable, USP VI class epoxies. The first reinforcement layer increases the stiffness of the base and proximal part of the electrode array mainly through the effect of increased thickness. The material of the first reinforcement layer may have an elastic modulus that is lower than, equal to or higher than the elastic modulus of the materials composing the base and needles of the electrode array.

A second reinforcement layer extends over the distal part—the part furthest from the base—of the shafts of the electrode array. The second reinforcement layer is made of biocompatible, electrically insulating material. Preferably, the material of the second reinforcement layer is dissolvable in bodily fluids or aqueous solutions. Preferably, the material of the second reinforcement layer is bioresorbable. The second reinforcement layer can be made for instance from polyethylene glycol, PGA, PLGA, dextran or sucrose.

An important parameter in selecting the material for the second reinforcement layer is the time required for degradation or bioresorption of the material. If after implantation of the electrode array into neural tissue the time needed for the complete resorption of the second reinforcement layer is longer than 3-4 weeks, it is highly likely that a fluid-filled void will remain around the shafts of the electrode array. In this case, the contact between the electrode contacts of the array and the surrounding neural tissue is insufficient for proper functioning of the array. Moreover, the adherence of the array to the neural tissue will be very poor. On the other hand, if the material of the second reinforcement layer degrades or dissolves very rapidly under certain circumstances, there is a chance that the second reinforcement layer already loses its function already prior to or during implantation of the electrode array. This may for instance happen to a second reinforcement layer made out of sucrose when exposed to the typical temperature and humidity of an operating room. For these reasons, the second reinforcement layer is preferably made out of a material with a resorption time of less than 4 weeks but higher than several hours, such as specific types of PLGA.

The second reinforcement layer increases the stiffness of the distal part of the electrode array mainly through the effect of increased thickness. The material of the second layer may have an elastic modulus that is lower than, equal to or higher than the elastic modulus of the materials composing the needles of the electrode array.

The preferred thickness of the second reinforcement layer is between 50 and 200 microns, and more preferably between 100 and 150 microns.

There is an overlap between the first and the second reinforcement layer, such that the shafts are reinforced over their entire length. In the area of overlap, the second reinforcement layer is preferably applied on top the first reinforcement layer. Preferably, the extent of the overlap between the first and the second reinforcement layer is equal to or larger than 50 micron. Preferably, the extent of the overlap between the first and the second reinforcement layer is equal to or smaller than 500 micron.

When the needles of the electrode array are inserted in a coating bath for the application of the second reinforcement layer, the coating tends to form a meniscus between adjacent needles of the array. The skilled person understands that, dependent on the contact angle between the surface of the shafts and the coating, the meniscus formed can be concave or convex. Typically, the materials used for the application of the second reinforcement layer are attracted to the surface material of the uncoated shafts such that the contact angle is inferior to 90° and a concave meniscus is formed. This is for instance the case with a PLGA coating applied to polyimide or Parylene-C. Alternatively, when the contact angle between the materials used for the application of the second reinforcement layer and the surface material of the uncoated shafts is superior to 90°, a convex meniscus is formed. For a typical material combination resulting in the formation of a concave meniscus, the apex of the meniscus corresponds to the bottom of the concave meniscus. Alternatively, for a material combination resulting in the formation of a convex meniscus, the apex of the meniscus corresponds to the top of the convex meniscus.

When the apex of the meniscus does not come into contact with the base of the array, upon retraction of the array from the coating bath, a coating layer will adhere to the individual needles without forming a coating bridge between the adjacent needles. In contrast, when the apex of this meniscus comes into contact with the base of the array, a coating bridge is formed between the adjacent needles upon retraction of the array from the coating bath. In the latter case, the application of the second reinforcement layer transforms the electrode array from a comb-like structure into a wedge-like structure. This is undesirable because the insertion of a wedge-like structure into neural tissue requires much more force than the insertion of a comb-like structure and causes far more damage to the neural tissue.

To avoid the formation of a coating bridge between adjacent needles upon application of the second reinforcement layer, there is preferably substantially no overlap between the second reinforcement layer and the base of the electrode array. The skilled person understands that the amount of overlap between the second reinforcement layer and the base of the electrode array that can be allowed without the formation of a coating bridge depends amongst others on the materials of the needles, base and first reinforcement layer, the composition of the coating bath and the conditions of coating application such as temperature or retraction speed of the electrode array from the coating bath. Preferably, the proximal part of the needles of the electrode array—over which the first reinforcement layer extends—has a length that is greater than the overlap distance between the first and the second reinforcement layer.

It is an advantage of the electrode array that the first and second reinforcement layers reinforce the base and shafts of the flexible electrode array and thus allow the electrode array's shafts to be inserted in the neural tissue or brain meninges of a human or other mammal.

It is an additional advantage of the electrode array that the second reinforcement layer dissolves or is resorbed after insertion such that afterwards the shafts can move together with the neural tissue in which the electrode array has been inserted. Meanwhile, the first reinforcement layer preferably does not degrade such that the base of the electrode array remains sufficiently stiff to stay in place.

It is an additional advantage that the first reinforcement layer increases the thickness of the base of the electrode array, thereby increasing the contact area between the base of the electrode array and the surface of the neural tissue into which the shafts of the electrode array are inserted. Consequently, the electrode array has more tendency to stay in place due to the increased support and friction offered by this larger surface area. Furthermore, it allows attachment to a supporting platform.

It can be an additional advantage of the electrode array that the second reinforcement layer does not substantially overlap with the base. As a result, during application of the second reinforcement layer no coating bridge between two adjacent shafts will be formed. Each shaft is thus fully coated but the spaces in between the shafts are not bridged by means of the second reinforcement layer. Consequently, insertion of the electrode array requires less force and causes less tissue damage since only the individually coated needle-like shafts need to penetrate the meninges and neural tissue.

In the remainder of this disclosure, a partial realization of an electrode array according to the first aspect of the invention, comprising a base and one or more shafts but not comprising a first and second reinforcement layer, can be referred to as an "uncoated electrode array".

In the remainder of this disclosure, a partial realization of an electrode array according to the first aspect of the invention, comprising a base, one or more shafts and a first reinforcement layer; but not comprising a second reinforcement layer, can be referred to as a "partially coated electrode array".

In the remainder of this disclosure, the "coated base" of the electrode array refers to the base of the electrode array together with the first reinforcement layer applied to said base.

In some embodiments of the electrode array, the proximal part has a length greater than or equal to 50 microns and smaller than or equal to 500 microns. Preferably, the proximal part has a length that is greater than the overlap distance between the first and the second reinforcement layer.

It is an advantage of a judicious choice of the length of the proximal part that three objectives can be realized simultaneously. In first place, the needles of the array can be reinforced over their entire length through the overlap between the first and second reinforcement layer. In second place, the extent to which the first reinforcement layer—which is preferably not dissolvable nor resorbable—will protrude into the tissue upon insertion of the electrode array can be limited. In third place, the formation of a coating bridge between adjacent needles of the electrode array can be avoided.

In some embodiments of the electrode array, the distal tips of the shafts of the electrode array have a tip angle inferior to 45°, wherein the tip angle is defined as the most acute angle found on the distal tips of the shafts. Preferably, the distal tips of the shafts are wedge-shaped or pyramid-shaped.

It is an advantage of these embodiments that an electrode array with sharper tip angles requires less force for insertion into neural tissue.

In some embodiments of the electrode array, the coated base of the electrode array comprises one or more orifices.

It is an advantage of these embodiments that tissue can grow through the orifices, thereby anchoring the electrode array into place. Alternatively, the orifices can be used to anchor the electrode array to another surgically introduced mechanical structure. This anchoring can be done by means of a mechanism such as for instance a clicking mechanism or by means of a biocompatible glue or polymer. Preferably, orifices that are to be used for anchoring the array to tissue extend all the way through the base of the array and the first reinforcement layer in the thickness direction and have a diameter that is on the order of tens of microns. Preferably, the base of the electrode array comprises more than 10 of such orifices. Preferably, orifices that are to be used for anchoring the array to a mechanical structure have a diameter that is on the order of hundreds of microns. Preferably, these orifices are distributed over the coated base of the electrode array. Preferably, these orifices are arranged over the coated base of the electrode array in a two-dimensional pattern.

In some embodiments of the electrode array, the connector cable is a split multi-core meandering cable. In the context of this disclosure, the term "multi-core" means that the connector cable comprises two or more wires, wherein a wire is an electrical conductor surrounded by electrical insulation. Preferably, the connector cable comprises one wire per electrode contact of the electrode array. Preferably, each of the electrode contacts of the array is electrically connected to a separate wire of the connector cable. Alternatively, the connector cable might comprise a smaller or larger number of wires than the number of electrode contacts of the electrode array. In the first alternative case, two or more electrode contacts might be connected to the same wire or one or more electrode contacts might remain unconnected. In the second alternative case, two or more wires might be connected to the same electrode contacts or one or more wires might remain unconnected. Each of the wires of the cable might comprise a solid or a stranded conductor.

Preferably, not all of the cable's wires are grouped together in a single sheath, but the wires are distributed over multiple separate sheaths. For instance, in the case of a connector cable comprising 16 wires, these wires can be distributed over 4 separate sheaths wherein each sheath comprises 4 wires. In this example, the connector cable thus comprises 4 separate cables, wherein the cross-section of each of the separate cables—each of them comprising 4 wires and a sheath—is smaller than the cross section of a cable comprising 16 equivalent wires and a sheath. Preferably, these separate cables are not attached to each other, except at their respective ends. Preferably, each of the separate cables is pre-formed in a meandering shape.

It is an advantage of these embodiments that the torsion stiffness of a split multi-core cable is lower than the torsion stiffness of a single multi-core cable carrying an equivalent number of wires of equivalent cross-section, due to a lower polar moment of inertia of the separate cable.

It is an additional advantage of these embodiments that a preformed meandering cable has excess length and is therefore stretchable.

Because of its lower torsion stiffness and stretchability, the split multi-core meandering connector cable reduces the torsion forces exerted on the electrode array, originating from twists and pulls in the connector cable which are almost unavoidable during surgery. By limiting the torsion forces transmitted to the electrode array, the split multi-core meandering cable decreases the chance of damaging or dislodging the electrode array.

According to a second aspect of the invention, a neural implant is disclosed, the device comprising:
  one or more neural electrode arrays;
  an electronics unit;
  wherein the connector cables of the one or more electrode arrays are electrically connected to said electronics unit.

The one or more neural electrode arrays of the implant are implantable in neural tissue of a human or other mammal and are aimed at neural signal recording and/or neurostimulation of said tissue.

Preferably, the electronics unit is implanted between said neural tissue and one or more of the protective layers surrounding said neural tissue. For instance, in case of implantation of the electrode arrays into the brain, the electronics unit can be implanted between the brain meninges and the skull.

Preferably, the electronics unit is provided with a system for wireless power transfer, such that the electronics unit can receive electrical power from a device located outside the body of the human or other mammal wherein the implant is implanted. The skilled person is aware of suitable systems for wireless power transfer over short distances, such as for instance inductive power transfer.

Preferably, the electronics unit is provided with a system for wireless data communication, such that the electronics unit can receive data from and send data to a device located outside the body of the human or other mammal wherein the implant is implanted. The skilled person is aware of suitable systems for wireless data communication over short distances, such as for instance NFC or Bluetooth.

In some embodiments of the device, the bases of the one or more electrode arrays are mechanically connected by means of a platform. Preferably, the bases of the one or more electrode arrays comprise orifices and are mechanically connected to the platform by means of a mechanism such as for instance a clicking mechanism or by means of a biocompatible glue or polymer.

Preferably, the platform is made out of a biocompatible material that is not dissolvable or resorbable by the body of a living human or other mammal. Suitable materials are well known to the person skilled in the art and comprise for instance Titanium, PMMA or silicone. Preferably, the platform is not implanted into neural tissue but floats on top of the neural tissue and is not connected to the skull.

It is an advantage of these embodiments that by mechanically connecting the one or more electrode arrays to a platform, the mechanical stability of the electrode arrays is increased. By increasing the mechanical stability of the one or more electrode arrays, the platform decreases the chance of damaging or dislodging the electrode arrays.

In some embodiments of the device wherein the device comprises a platform that is connected to the one or more electrode arrays of the device, the platform is created in situ.

For instance, in case of implantation of the electrode arrays into the brain, a platform can be created in situ wherein the temporary opening in the skull—necessary for the implantation of the electrode arrays—can serve as a mold for the casting of the platform out of for instance quick-curing, biocompatible silicone.

It is an advantage of these embodiments that the shape of the platform can be adapted to the surface shape of the underlying neural tissue.

It is an additional advantage of these embodiments that no dedicated attachment of the platform to biological tissue is required. After closing of the skull, the platform can stay in place due to its conformity with the underlying brain surface and the compression from the overlying skull surface.

In some embodiments of the device, the one or more electrode arrays are stored on a detachable holder, wherein the holder separates the one or more electrode arrays from each other. This holder serves as a temporary storage for the one or more electrode arrays; generally, the holder is not implanted and is preferably discarded during surgery. Optionally, the holder is adapted such that it can be reused as a platform to mechanically connect the bases of the one or more inserted electrode arrays as described above. In the latter case, the holder is not discarded during surgery.

It is an advantage of these embodiments that the holder protects the one or more electrode arrays against mechanical damage or contamination during storage or transportation.

It is an additional advantage of these embodiments that the holder separates the one or more electrode arrays such that they do not stick to each other.

It is an additional advantage of these embodiments that the holder allows to more easily grab onto the electrode arrays.

According to a third aspect of the invention, a method for the fabrication of a neural electrode array is disclosed, the method comprising the steps of:
  providing a planar substrate coating the planar substrate with a sacrificial layer;
  depositing at least a first layer of an electrically insulating material on the sacrificial layer;
  depositing one or more metal traces and electrode contacts on the first layer;
  depositing and patterning at least a second layer of an electrically insulating material on the first layer and the metal traces;
  applying the first reinforcement layer;
  applying the second, resorbable reinforcement layer.

The electrically insulating materials used for the at least a first layer and at least a second layer are flexible and bio-compatible. Examples of suitable materials are polyimide or Parylene-C. Preferably, the materials used for the first and the second layer are the same. The second layer is patterned such that it covers the metal traces completely, except for at the electrode contacts and bond pads.

The surface of the planar substrate serves as substrate for the manufacturing of the electrode array. An example of a suitable substrate is for instance a Silicon wafer. Depending on the specific method chosen for the application of the first reinforcement layer, the neural electrode array may be released from the substrate before or after the application of said layer. Release can be done by e.g. dissolving the aforementioned sacrificial layer.

Optionally, the planar substrate can be patterned and etched anisotropically to create a mold for the neural electrode array in the substrate, wherein the mold is shaped such that a sharp-tipped pattern is transferred to the shafts of the electrode array which is built on top.

In some embodiments of the method, the first reinforcement layer is applied using a first dip coating process and the second reinforcement layer is applied using a second dip coating process.

The electrode array is released from the substrate before it undergoes the first dip coating process. In the first dip coating process, the base of the electrode array and the proximal part of the electrode array's shafts are coated by insertion into a coating bath. The insertion starts from the side of the base opposite to the side from which the shafts are protruding. The electrode array is further inserted into the coating bath until the base and the proximal part of the shafts are submerged in the bath. The first dip coating process forms the first reinforcement layer on the base and the proximal part of the shafts of the electrode array.

In the second dip coating process, the distal part of the electrode array's shafts is coated by insertion into a coating bath. The insertion starts from the distal ends of the shafts, opposite to the side where the shafts are connecting to the electrode array's base. The electrode array is further inserted into the coating bath until the distal part of the shafts is submerged in the bath. Upon insertion of the shafts into the coating bath, capillary tension will cause the coating material to form a concave meniscus between adjacent shafts. If the shafts are inserted into the coating bath until the apex of the concave meniscus touches the base of the electrode array, the coating will form a coating bridge between adjacent shafts upon retraction of the implant from the coating bath. To avoid this phenomenon, the shafts of the electrode array are slowly inserted until the apex of the concave meniscus comes within a predetermined distance of the base of the electrode array. This distance is chosen such that bridging cannot occur between the shaft of the electrode array. After reaching its maximal insertion depth, the electrode array is retracted. The base of the electrode array is not inserted into the coating bath during the second dip coating process. The base of the electrode array does not touch the coating bath during the second dip coating process. The second dip coating process forms the second reinforcement layer on the distal part of the shafts of the electrode array.

It is an advantage of these embodiments that the two-step dip coating process reliably covers the electrode array since in each of both steps, the electrode array can be clamped in a location that is not inserted into the coating bath.

It is an additional advantage of these embodiments that the second dip coating process decreases the tip angle of the distal ends of the shafts.

It is an additional advantage of these embodiments that the second dip coating process does not form a coating bridge between the individual shafts of the electrode array because the base of the electrode array does not touch the coating bath.

In some embodiments of the method, the first reinforcement layer is applied using a molding process and the second reinforcement layer is applied using a dip coating process.

The electrode array is released from the substrate before it undergoes the molding process. In the molding process, the electrode array is inserted into a prefabricated mold. Subsequently, the material for the first reinforcement layer is cast into the mold. The mould is configured such that the material for the first reinforcement layer covers the base and the proximal part of the shafts of the electrode array. After hardening of the first reinforcement layer, the electrode array is demolded. Subsequently, the second reinforcement layer is applied to the electrode array using a dip coating process.

The dip coating process is similar to the second dip coating process described above. The advantages of the dip coating process are similar to the advantages of the second dip coating process described above.

It is an advantage of these embodiments that the geometry of the first reinforcement layer can be chosen freely.

In some embodiments of the method, the first reinforcement layer is applied using a wafer-scale deposition process and the second reinforcement layer is applied using a dip coating process.

In the deposition process, the first reinforcement layer is deposited before the electrode array is released from its carrier substrate. The skilled person is aware of suitable techniques for the deposition of the first reinforcement layer, one possible example is the use of lithographic deposition.

The electrode array is released from the substrate before it undergoes the dip coating process. The dip coating process is similar to the second dip coating process described above. The advantages of the dip coating process are similar to the advantages of the second dip coating process described above.

It is an advantage of these embodiments that the first reinforcement layer can be deposited at wafer scale, thereby possibly improving the consistency between batches and increasing the cost and throughput scalability and accuracy of fabrication.

In some embodiments of the method, the first reinforcement layer is fabricated separately from the uncoated electrode array. The first reinforcement layer can be manufactured using any suitable process known to the person skilled in the art, such as for instance a molding process or a deposition process. The manufacturing of the first reinforcement layer may involve laser cutting. Subsequently, the first reinforcement layer is attached to the uncoated electrode array before the second reinforcement layer is applied using a dip coating process. The first reinforcement layer can be attached to the uncoated electrode array using any suitable attachment known to the person skilled in the art, such as for instance by gluing with a biocompatible glue or by thermal means.

The dip coating process is similar to the second dip coating process described above. The advantages of the dip coating process are similar to the advantages of the second dip coating process described above.

It is an advantage of these embodiments that the manufacturing process of the first reinforcement layer can be freely chosen, thereby enabling to optimize the fabrication of the electrode array towards cost, accuracy or throughput.

In some embodiments of the method, the planar substrate is a Silicon wafer. Preferably, the {111} crystal planes of the wafer are inclined at a substantially sharp angle to the surface of the wafer and the wafer can be patterned and etched anisotropically to create a mold for the neural electrode array in the wafer. In these embodiments, the deposition of at least a first layer of electrically insulating material on the sacrificial layer partially fills the substrate.

In the context of this disclosure, a substantially sharp angle is an angle inferior to 54.7°, which is the inclination between the {111} crystal planes and the surface of a standard (100) silicon wafer.

It is an advantage of these embodiments that the {111} crystal planes of silicon are non-etching in wet anisotropic etchants such as KOH and TMAH. Etch mask deposition, lithographic mask patterning and anisotropic etching of the wafers according to these embodiments creates pits with almost atomically sharp tips that can be used as a substrate for the fabrication of the electrode array. The electrode arrays manufactured using this substrate will have sharp tip angles on the distal ends of the shafts, thereby requiring less force for their insertion into neural tissue.

DETAILED DESCRIPTION

The present disclosure will be described in terms of specific embodiments, which are illustrative of the disclosure and which are not to be construed as limiting. It will be appreciated that the present disclosure is not limited by what has been particularly shown and/or described and that alternatives or modified embodiments could be developed in the light of the overall teaching of this disclosure. The drawings described are only schematic and are non-limiting.

Reference throughout this description to "one embodiment" or "an embodiment" means that a particular feature, structure or characteristic described in connection with the embodiments is included in one or more embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Figure 1:
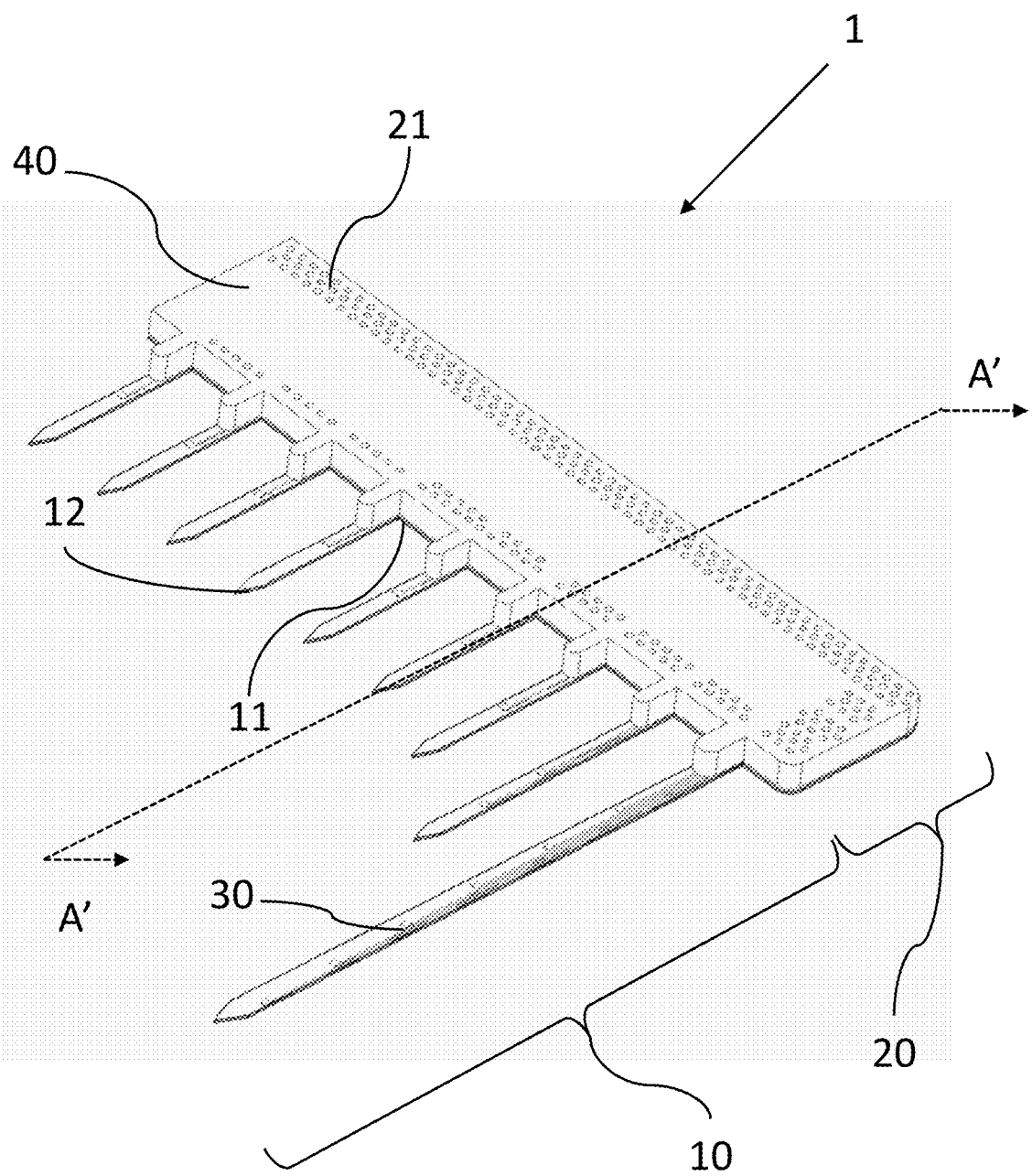
FIG. 1 schematically illustrates an embodiment of a partially coated electrode array, comprising a first reinforcement layer but not comprising a second reinforcement layer, according to the present invention.

FIG. 1 schematically illustrates an embodiment of a partially coated electrode array according to the present invention. The electrode array 1 according to FIG. 1 is substantially planar, i.e. two of its dimensions are substantially larger than the third. The electrode array comprises a substantially planar base 20 to which shafts 10, also called needles are attached. These shafts 10 all lay in substantially the same plane. The shafts 10 lay in substantially the same plane as the electrode arrays base 20. The shafts 10 all protrude in the same direction from the same side of the electrode array's base 20. The electrode array 1 thus has a comb-like structure, which is well known to the person skilled in the art. Preferably, the uncoated electrode array, comprising the base 20 and the shafts 10 has a thickness larger than 0.5 micron, more preferably larger than 1 micron. Preferably, the uncoated electrode array, comprising the base 20 and the shafts 10 has a thickness smaller than 100 micron, more preferably smaller than 50 micron.

The electrode array is made from a flexible, bio-compatible and electrically insulating material. These materials, such as polyimide or Parylene-C are well known to the person skilled in the art. Internally, the electrode array comprises traces of an electrically conducting material (not labelled in FIG. 1). These traces connect electrode contacts 30 on the shafts 10—places that are not covered by electrically insulating material—with a connector cable (not shown on FIG. 1) which connects to the base 20 of the electrode array 1. Preferably, the electrically conductive materials for the traces and the electrode contacts are selected from platinum, gold, iridium oxide, carbon nanotubes or PEDOT.

While in the embodiment shown, the spacing between the shafts is constant, this spacing may be variable. Preferably, the electrode array comprises more than 1 shaft, more preferably more than 5 shafts, even more preferably more than 10 shafts, most preferably more than 15 shafts. Preferably, the electrode array comprises less than 200 shaft, more preferably less than 100 shafts, even more preferably less than 50 shafts, most preferably less than 35 shafts. Preferably, each of the shafts has a width between 10 and 500 micron. Preferably, the inter-shaft distance is equal to or larger than 0.5 mm. Preferably, the inter-shaft distance is equal to or smaller than 1 mm. Preferably, the tip angle of the shafts 10 at their distal end 12 is inferior to 45°. More preferably, the tip angle of the shafts 10 at their distal end 12 is inferior to 30°. Even more preferably, the tip angle of the shafts 10 at their distal end 12 is inferior to 20°. The smaller the tip angle, the easier the electrode array can penetrate tissue.

Preferably, the electrode contacts are evenly spaced along the length of the shafts. Preferably, the electrode array comprises 1 or more electrode contacts per 10 mm of shaft length, more preferably 2 or more electrode contacts per 10 mm of shaft length, even more preferably 5 or more electrode contacts per 10 mm of shaft length, most preferably 10 or more electrode contacts per 10 mm of shaft length. Preferably, the electrode array comprises 100 or fewer electrode contacts per 10 mm of shaft length, more preferably 50 or fewer electrode contacts per 10 mm of shaft length, even more preferably 20 or fewer electrode contacts per 10 mm of shaft length. The skilled person will understand that the number of electrode contacts can be adapted to the neural tissue into which the electrode array will be inserted, as well as to the specific purpose of the electrode array. The skilled person will also understand that the spacing of the electrode contacts is a compromise between the resolution for recording in or stimulation of neural tissue and manufacturing complexity of the electrode array.

While in the embodiment shown, the lengths of the various shafts differ, these lengths may be identical. While in the embodiment shown, the lengths of the various shafts increase or decrease in monotonic fashion, the variations in shaft length may follow any pattern. Preferably, the shaft length is such that, upon insertion of the electrode array in neural tissue, the majority of the electrode contacts will be located in grey matter. Preferably, the shaft length is such that, upon insertion of the electrode array in neural tissue, the electrode contacts will be distributed over a substantial part of the thickness of the grey matter layer in the target region.

For instance, for probing of the grey matter of the human visual cortex, the shortest shaft of the electrode array is preferably longer than 0.2 mm, more preferably longer than 0.5 mm, even more preferably longer than 1 mm. The shortest shaft of the electrode array is preferably shorter than 3.5 mm, more preferably shorter than 3.0 mm, even more preferably shorter than 2.5 mm. The longest shaft of the electrode array is preferably longer than 20 mm, more preferably longer than 25 mm, even more preferably longer than 30 mm. The longest shaft of the electrode array is preferably shorter than 60 mm, more preferably shorter than 55 mm, even more preferably shorter than 50 mm. This enables the shortest shaft to probe the entire thickness of the grey matter layer on a gyrus of the visual cortex while the longest shaft can probe the entire extent of the grey matter layer adjacent to a sulcus of the visual cortex. The skilled person will understand that the length of the shafts can be adapted to the neural tissue into which the electrode array will be inserted, as well as to the specific purpose of the electrode array.

A first reinforcement layer 40 extends over the base 20 of the electrode array 1 and the proximal part—the part connecting to the base 20—of the shafts 10 of the electrode array 1. The first reinforcement layer 40 is made of biocompatible, electrically insulating material. By extending over the proximal part of the shafts 10, the first reinforcement layer 40 reinforces the shafts in the location that encounters the largest mechanical stress upon insertion of the electrode array into neural tissue. Preferably, the first reinforcement layer 40 extends over the proximal part of the shafts 10 over a distance equal to or larger than 50 microns. Preferably, the first reinforcement layer 40 extends over the proximal part of the shafts 10 over a distance equal to or smaller than 500 microns. Preferably, the first reinforcement layer 40 has a thickness equal to or larger than 100 microns. Preferably, the first reinforcement layer 40 has a thickness equal to or smaller than 500 microns.

Preferably, the material of the first reinforcement layer is not dissolvable in bodily fluids or aqueous solutions. Preferably, the material of the first reinforcement layer is not bioresorbable. The material of the first reinforcement layer may have an elastic modulus that is lower than, equal to or higher than the typical elastic modulus of a human or other mammal's neural tissue. Suitable materials for this layer include UV curable, USP VI class epoxies. The skilled person understands that the thickness of the first reinforcement layer can depend amongst others on the material of the first reinforcement layer. For instance, for a first reinforcement layer composed of epoxy, a thickness of around 250 micron appears to be suitable.

In the embodiment of FIG. 1, the base 20 and the first reinforcement layer 40 comprise a multitude of orifices 21. After insertion of the electrode array, connective tissue mag grow through these orifices, thereby locking the electrode array into place. Alternatively, the electrode array may be glued into place using a biocompatible glue or polymer where the orifices provide extra surface area for the attachment of said glue or polymer to the electrode array.

Preferably, orifices that are to be used for anchoring the array to tissue extend all the way through the base of the array and the first reinforcement layer in the thickness direction and have a diameter that is on the order of tens of microns. Preferably, orifices that are to be used for anchoring the array to a mechanical structure have a diameter that is on the order of hundreds of microns. Preferably, the orifices cover more than 10% of the surface area of the base of the electrode array.

Figure 2:
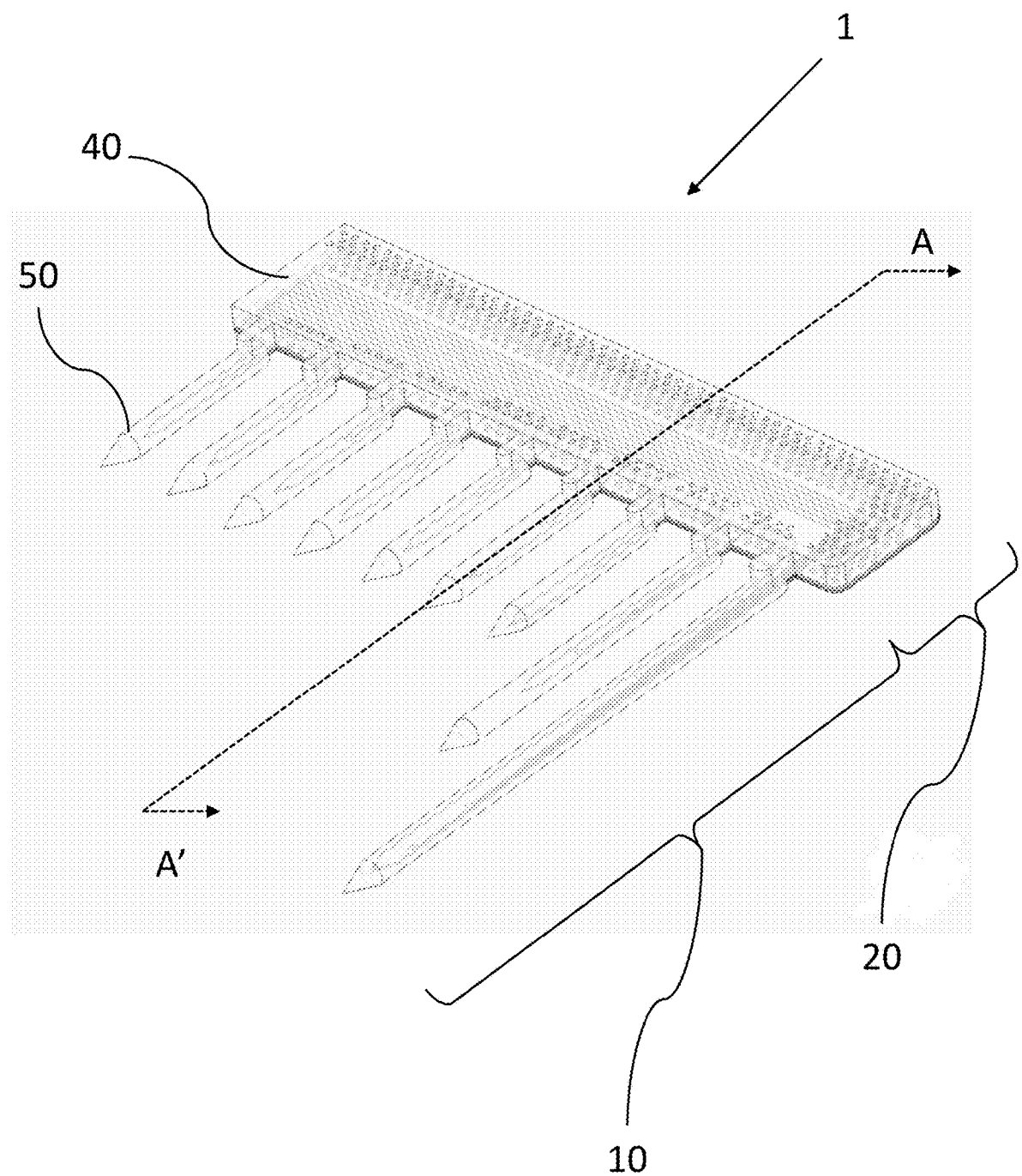
FIG. 2 schematically illustrates an embodiment of an electrode array, comprising a first reinforcement layer and a second reinforcement layer, according to the present invention.

FIG. 2 schematically illustrates an embodiment of an electrode array according to the present invention. The embodiment of FIG. 2 corresponds to the embodiment of FIG. 1 with the addition of the second reinforcement layer 50. All of the characteristics of the embodiment of FIG. 1 are present in the embodiment of FIG. 2, but are not necessarily labelled for readability purposes.

The second reinforcement layer 50 extends over the distal part of the shafts 10 of the electrode array 1. The second reinforcement layer 50 is made of biocompatible, electrically insulating material. The second reinforcement layer can be made for instance from polyethylene glycol, PGA, PLGA, dextran or sucrose. Preferably, the material of the second reinforcement layer is dissolvable in bodily fluids or aqueous solutions. Preferably, the material of the second reinforcement layer is bioresorbable. The second reinforcement layer increases the stiffness of the distal part of the electrode array mainly through the effect of increased thickness. The material of the second layer may have an elastic modulus that is lower than, equal to or higher than the elastic modulus of the materials composing the needles of the electrode array. The skilled person understands that the necessary thickness of the second reinforcement layer can depend amongst others on the material of the second reinforcement layer and on the geometry if the shafts. For instance, for a second reinforcement layer composed of PLGA, a diameter of around 120 micron appears to be suitable for each of the coated shafts of the array.

There is an overlap between the first 40 and the second reinforcement layer 50, such that the shafts 10 are reinforced over their entire length. In the area of overlap, the second reinforcement layer 50 is applied on top the first reinforcement layer 40. Preferably, the extent of the overlap between the first and the second reinforcement layer is equal to or larger than 50 micron. Preferably, the extent of the overlap between the first and the second reinforcement layer is equal to or smaller than 500 micron.

There is substantially no overlap between the second reinforcement layer 50 and the base 20 of the electrode array 1 to avoid the possible bridging between the shafts 10 when the second reinforcement layer 50 would be applied using a dip-coating process.

Figure 3:
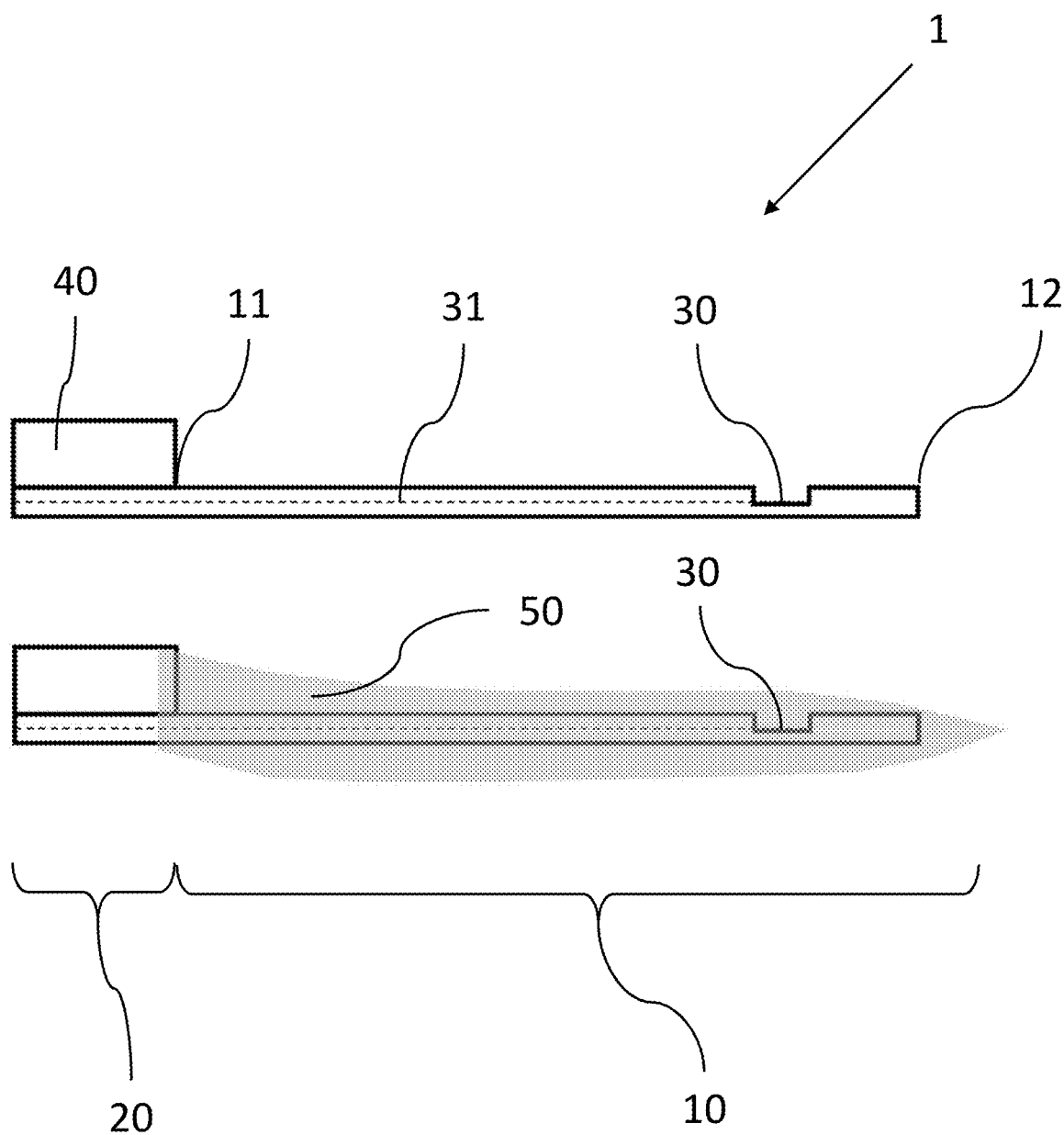
FIG. 3 schematically illustrates a cross-section throughout the embodiments of FIG. 1 and FIG. 2 according to the line A-A'.

FIG. 3 schematically illustrates a cross-section throughout the embodiments of FIG. 1 and FIG. 2 according to the line A-A'. On top of FIG. 3, the cross-section through the embodiment of FIG. 1 is shown. One electrode contact 30 is schematically shown. On the bottom of FIG. 3, the cross-section through the embodiment of FIG. 2 is shown. The second reinforcement layer 50 overlaps with the first reinforcement layer 40 to ensure reinforcement over the entire length of the shafts. The second reinforcement layer 50 covers the electrode contact 30. It is only after insertion, when the second reinforcement layer 50 has been dissolved or resorbed that the electrode contact 30 can make contact with the neural tissue. Preferably, the second reinforcement layer 50 is applied using a technique that yields sharp tips at the distal ends 12 of the shafts 10. Dip-coating is the most well-known and most economical of these techniques. A second reinforcement layer that is applied using a dip-coating process typically follows the tip angle of the uncoated shafts in the plane of the shafts.

Figure 4:
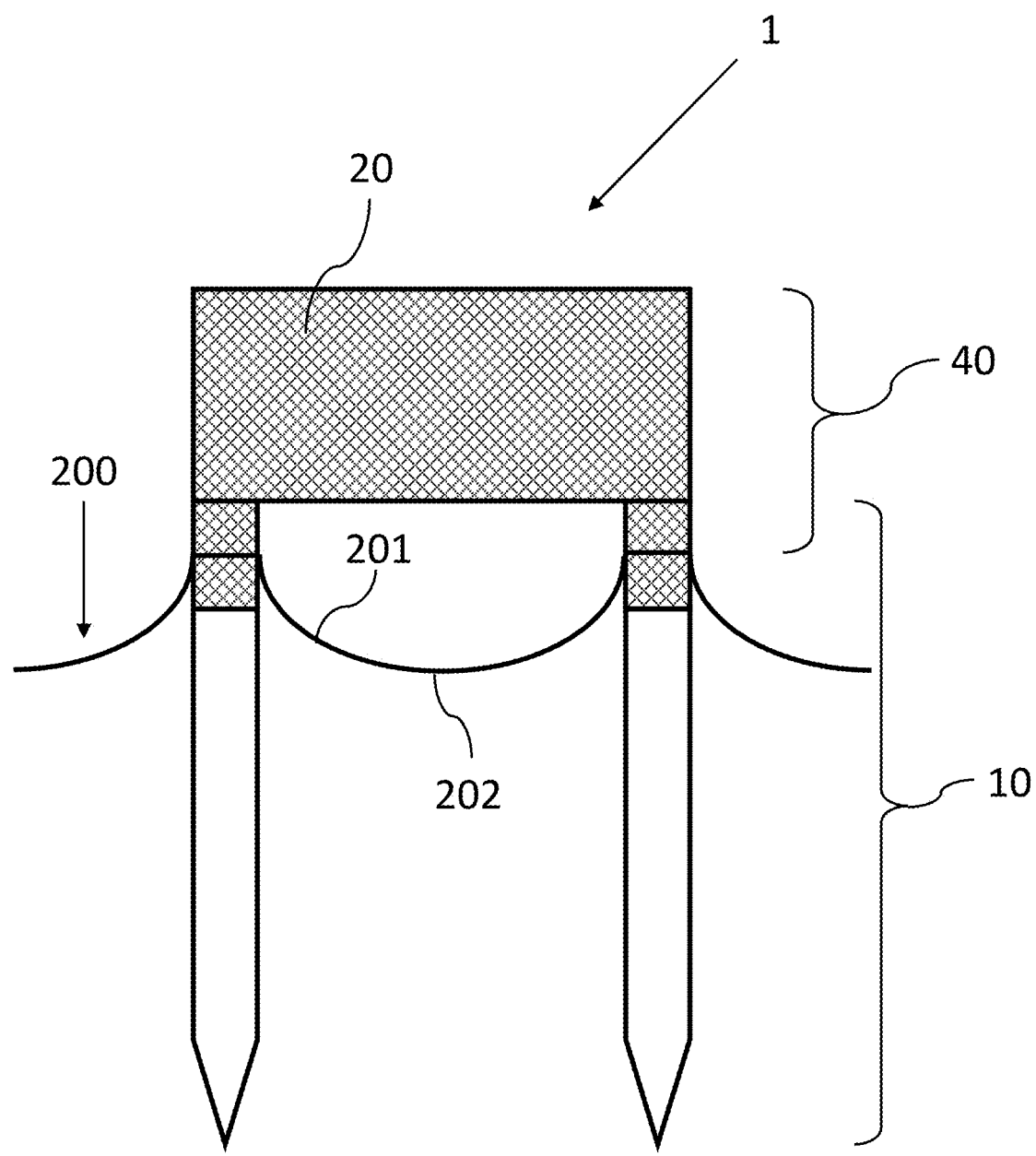
FIG. 4 schematically illustrates the formation of a fluid meniscus between adjacent shafts during the application of the second reinforcement layer using a dip-coating process.

FIG. 4 schematically illustrates the application of a second reinforcement layer to a partially coated electrode array 1 using a dip-coating process. In this process, the distal part of the electrode array's shafts 10 are coated by insertion into a coating bath 200. The insertion starts from the distal ends of the shafts, opposite to the side where the shafts are connecting to the electrode array's base 20. The electrode array 1 is further inserted into the coating bath 200 until the distal parts of the shafts 10 are submerged in the bath. Upon insertion of the shafts 10 into the coating bath 200, capillary tension will cause the coating material to form a concave meniscus 201 between adjacent shafts. If the shafts 10 are inserted into the coating bath 200 until the apex 202 of the concave meniscus 201 touches the base 20 of the electrode array 1, the coating will form a coating bridge between adjacent shafts upon retraction of the array 1 from the coating bath 200.

To avoid this phenomenon, the shafts 10 of the electrode array 1 are slowly inserted until the apex 202 of the concave meniscus 201 comes within a predetermined distance of the base 20 of the electrode array 1. This distance is chosen such that bridging cannot occur between the shafts 10 of the electrode array 1. After reaching its maximal insertion depth, the electrode array 1 is retracted. The base 20 of the electrode array 1 is not inserted into the coating bath during the dip coating process. Preferably, the base 20 of the electrode array does not touch the surface of the coating bath during the dip coating process.

Preferably, the electrode array 1 is inserted sufficiently deep into the coating bath 200 such that the surface of the fluid meniscus 201 does overlap with the first reinforcement layer 40. This ensures that the second reinforcement layer, applied by the dip-coating process, overlaps with the first reinforcement layer 40.

Figure 5:
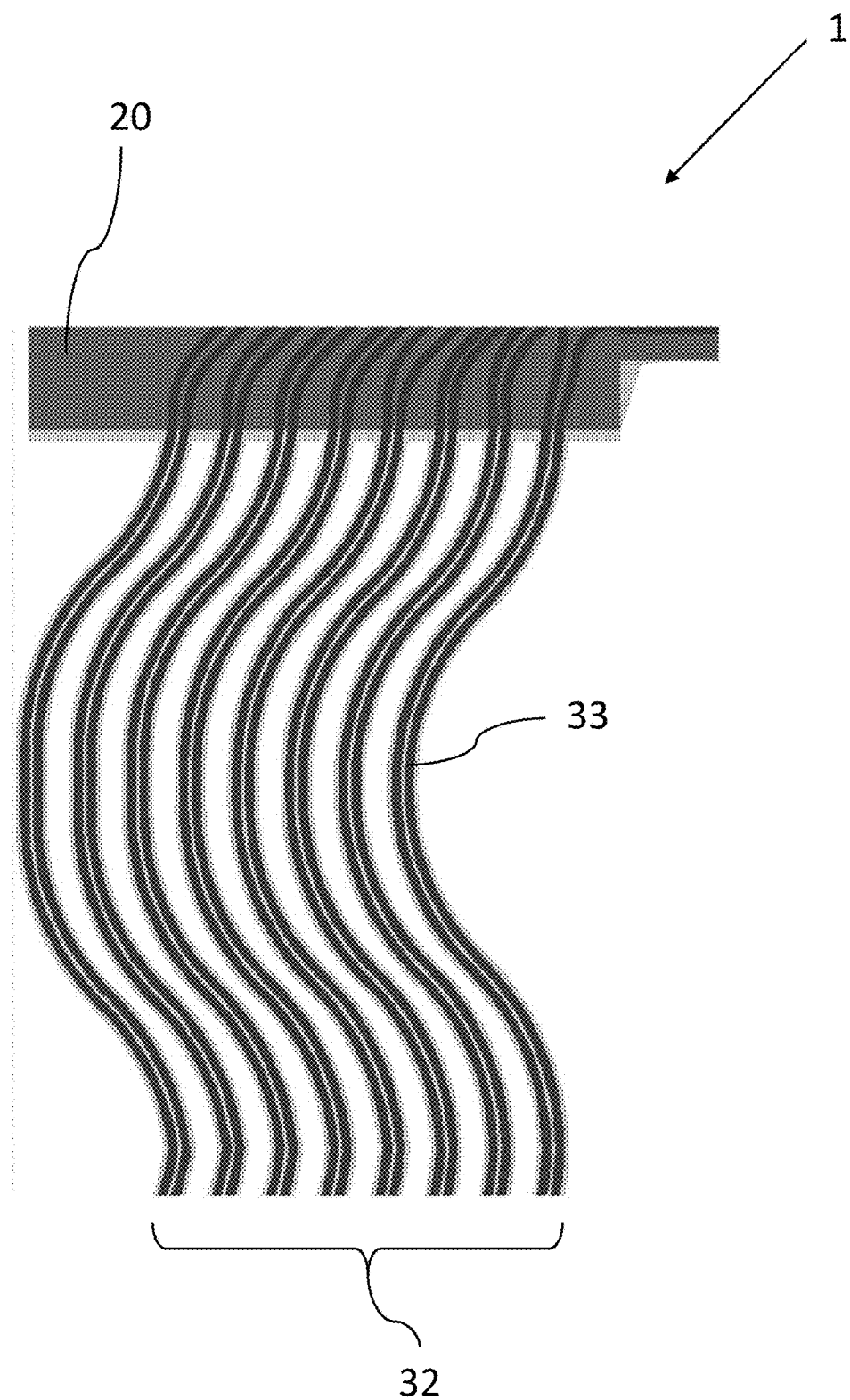
FIG. 5 schematically illustrates an embodiment of the connector cable of the electrode array according to the present invention.

FIG. 5 schematically illustrates an embodiment of the connector cable of the electrode array according to the present invention. In the embodiment of FIG. 5, the connector cable 32 is a split multi-core meandering cable, which comprises 16 wires 33. The wires 33 are individually insulated and grouped per pair in a protective sheath. Each of the wires 33 of the cable 32 might comprise a solid or a stranded conductor. The 8 groups of two wires 33 each connect on one end to the base 20 of the electrode array 1. On the other end, the 8 groups of wires 33 preferably connect to a common electrical connector (not shown in FIG. 5). Preferably, the 8 separate groups of wires are not attached to each other between both ends. Preferably, the 8 separate groups of wires are pre-formed in a meandering shape. When compared to a connector cable grouping all 16 wires together in a common protective sheath, a connector cable comprising 8 groups of 2 wires each has a far lower polar moment of inertia. The skilled person is capable of calculating the polar moment of inertia of a cable. Depending on the amount of wires, the splitting scheme and the materials involved, the polar moment of inertia of a split cable as shown in FIG. 5 can be one to two orders of magnitude smaller than the polar moment of inertia of a non-split cable carrying the same amount of wires of equal cross-section. Due to its lower moment of inertia, the embodiment of the connector cable 32 of FIG. 5 reduces the torsion forces exerted on the electrode array 1, originating from twists and pulls in the connector cable 32 which are almost unavoidable during surgery. By limiting the torsion forces transmitted to the electrode array 1, the split multi-core meandering cable 32 decreases the chance of damaging or dislodging the electrode array 1.

Figure 6:
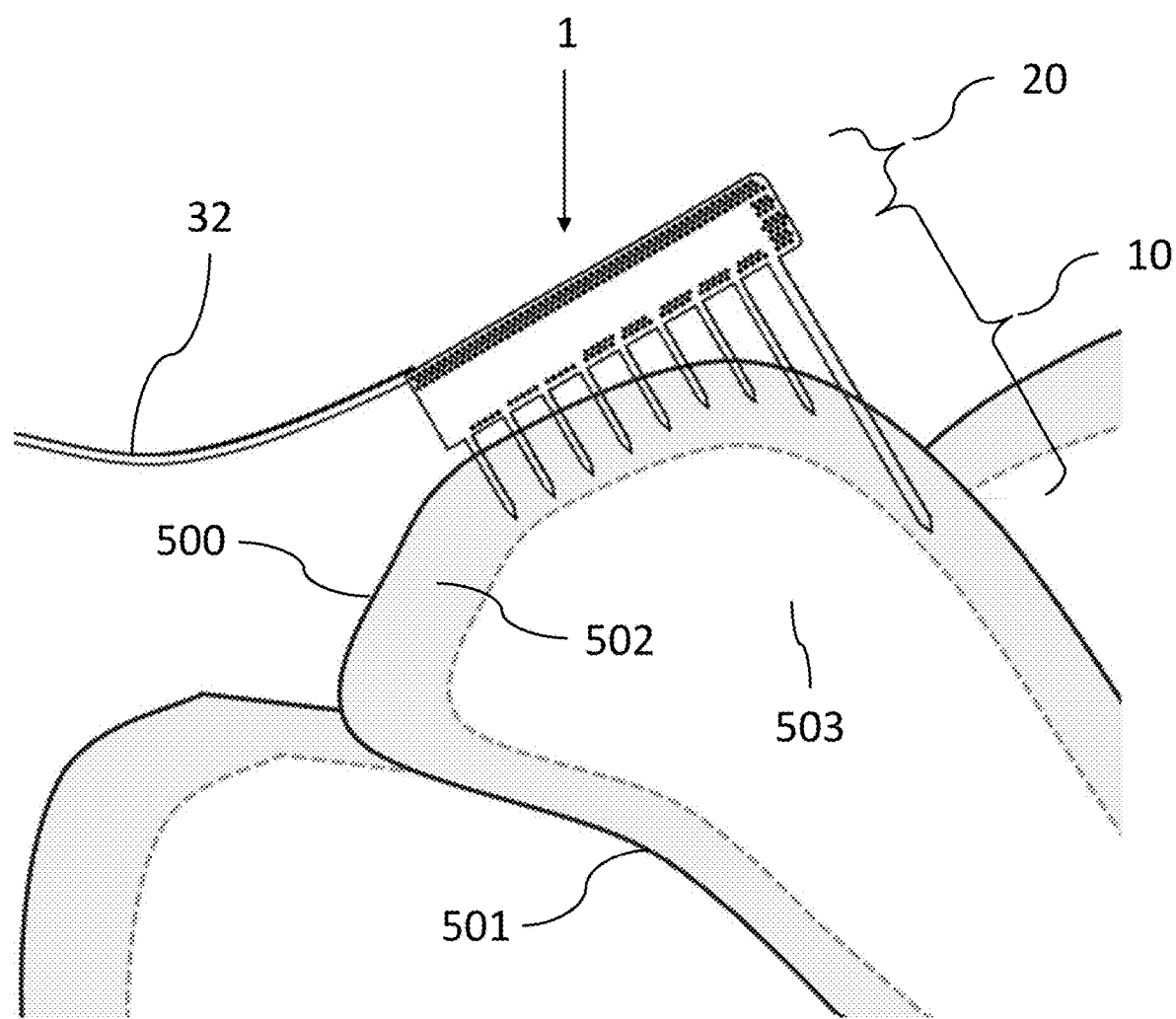
FIG. 6 schematically illustrates an embodiment of an electrode array that is inserted into the brain of a human or other mammal.

FIG. 6 schematically illustrates an embodiment of an electrode array that is inserted into a brain of a human or other mammal. The brain of a human or other mammal has a folded surface structure, comprising gyri or ridges 500 and sulci or fissures 501. Internally, the brain is substantially composed of grey matter 502 and white matter 503, wherein the grey matter is predominantly found in a layer with a thickness of a couple of millimetres along the surface of the brain.

In the embodiment of FIG. 6, an electrode array 1 is inserted into a brain of a human or other mammal through the surface of a gyrus 500. The shafts 10 of the array are inserted into the gyrus 500 while the base 20 and the connector cable 32 are not. For some purposes, it is important for the electrode contacts on the shaft to extend over a substantial part of the grey matter 502. This is for instance the case for a visual prosthesis which has the purpose of inducing visual perception through electrostimulation of the visual cortex. Since it is known that there exists a geometrical mapping between the grey matter of the visual cortex and the geometry and resolution of perceived images, it is considered of particular importance that the electrode contacts of a visual prosthesis are distributed over a substantial part of the grey matter of the visual cortex.

While the grey matter 502 laying directly on the surface of the gyrus 500 is easily accessible for insertion of an electrode array 1, the grey matter 502 buried in the sulcus 501 is not. A possible solution to this problem is the insertion of an electrode array 1 with shafts 10 of different length as illustrated in FIG. 6. The shaft geometry illustrated in FIG. 6 allows the electrode array to probe into the grey matter adjacent to the sulcus 501 without needlessly penetrating into the white matter 503.

Figure 7:
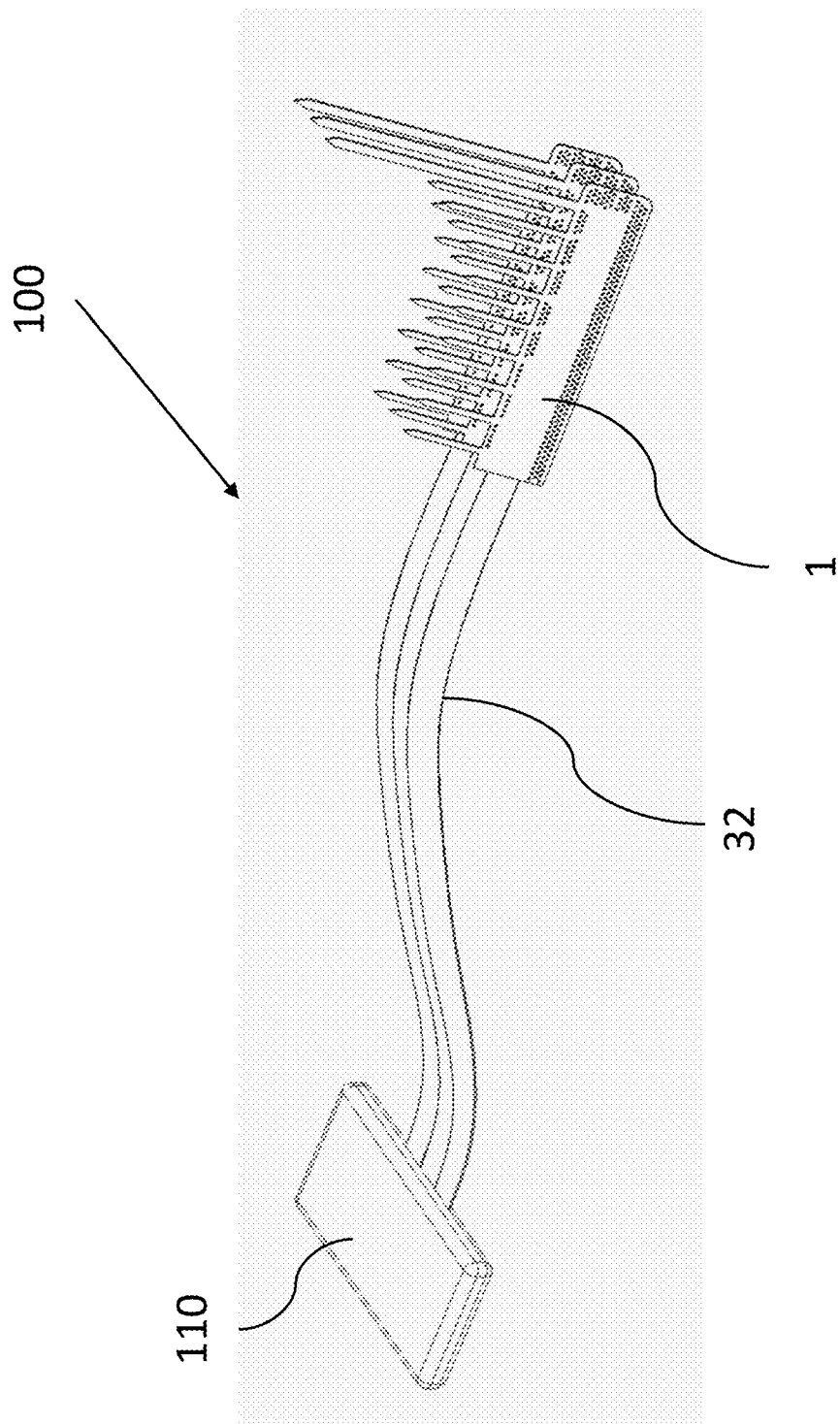
FIG. 7 schematically illustrates an embodiment of an implant according to the present invention.

FIG. 7 schematically illustrates an embodiment of an implant according to the present invention. In the embodiment shown, the implant 100 comprises three electrode arrays 1. However, the skilled person will understand that the number of electrode arrays can be freely chosen according to the location and purpose of the implant. Each electrode array is connected to the electronics unit 110 by means of a connector cable 32.

Preferably, the electronics unit is implanted between said neural tissue and one or more of the protective layers surrounding said neural tissue. When the device 100 is implanted for instance in the brain, the shafts of the electrode arrays 1 are inserted through the brain meninges into the neural tissue. Preferably, the electronics unit 110 is attached between the brain meninges and the skull.

Preferably, the electronics unit 110 is provided with a system for wireless power transfer, such that the electronics unit can receive electrical power from a device located outside the body of the human or other mammal wherein the implant is implanted. The skilled person is aware of suitable systems for wireless power transfer over short distances, such as for instance inductive power transfer.

Preferably, the electronics unit is provided with a system for wireless data communication, such that the electronics unit can receive data from and send data to a device located outside the body of the human or other mammal wherein the implant is implanted. The skilled person is aware of suitable systems for wireless data communication over short distances, such as for instance NFC or Bluetooth.

Figure 8:
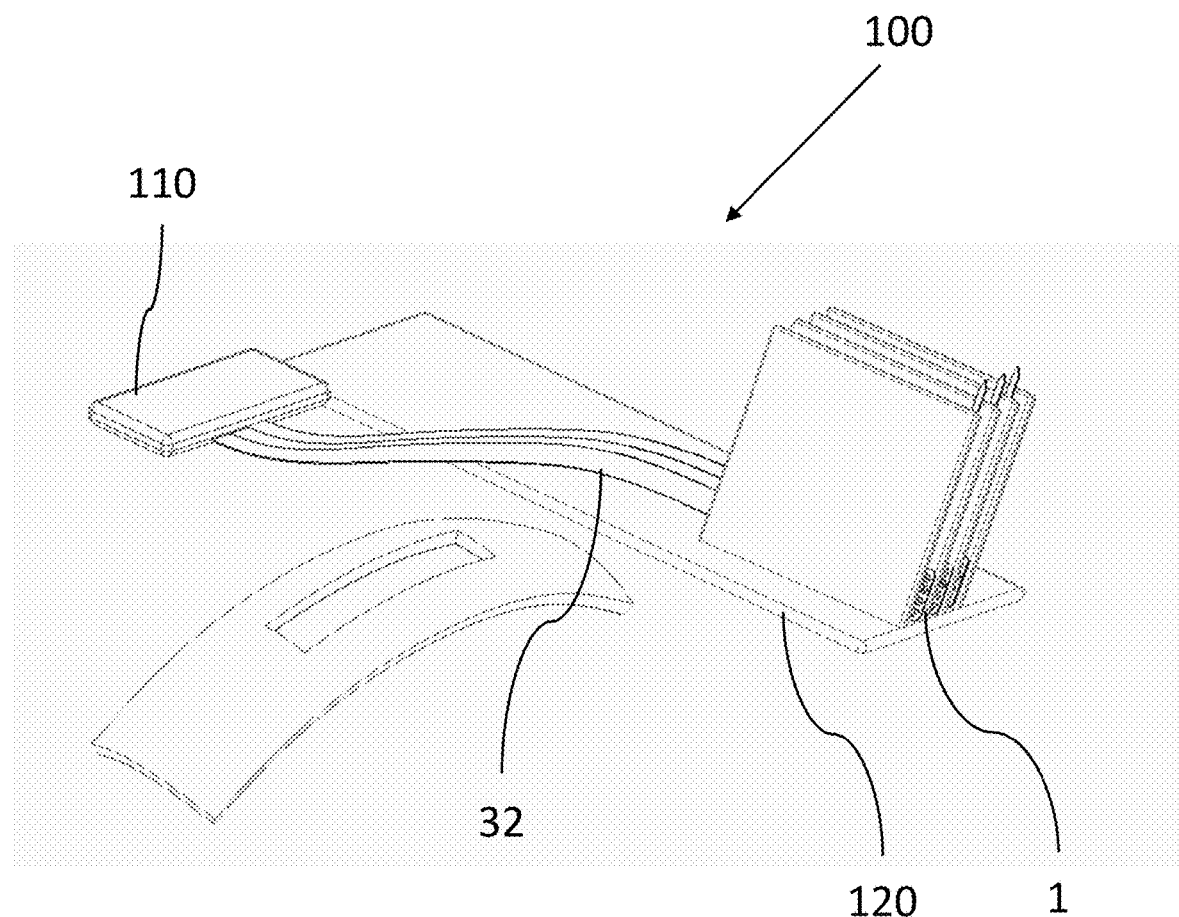
FIG. 8 schematically illustrates an embodiment of an implant, comprising a detachable holder, according to the present invention.

FIG. 8 schematically illustrates an embodiment of an implant, comprising a detachable holder, according to the present invention. In a typical embodiment of the implant 100, about 20 electrode arrays 1 will be present. In order to allow an orderly insertion, the electrode arrays can be pre-sorted on a detachable holder 120 or platform that is assembled to the permanent parts of the implant 100.

The holder 120 protects the electrode arrays 1 against mechanical damage or contamination during storage or transportation, separates the electrode arrays 1 such that they do not stick to each other and allows to more easily grab on of the electrode arrays 1.

During implantation of the implant 100 into the brain, the electronics unit 110 is attached to the skull (or placed in a recess therein) after which the electrode arrays 1 are sequentially inserted in the brain. Finally the holder 120 is removed. The holder 120 may be 3D printed in a biocompatible polymer (PEEK or polyamide) and features vertical protrusions that keep the electrode arrays 1 separated from each other during storage, transport, sterilization and surgery.

Figure 9:
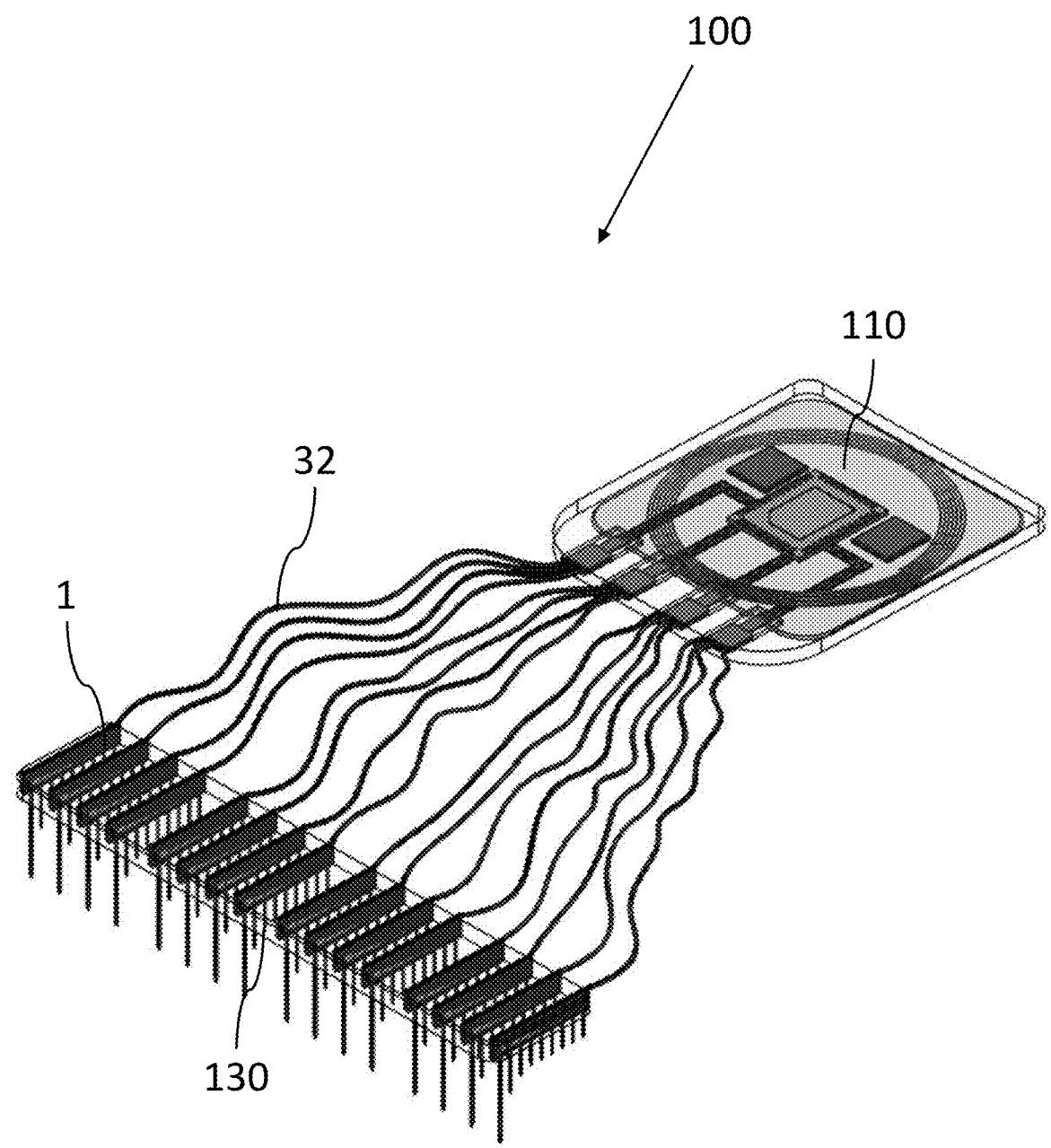
FIG. 9 schematically illustrates an embodiment of an implant, comprising a platform, according to the present invention.

FIG. 9 schematically illustrates an embodiment of an implant 100, comprising a platform 130, an electronics unit 110 and multiple electrode arrays 1 according to the present invention. In the embodiment of FIG. 9, the bases of the one or more electrode arrays 1 are mechanically connected by means of a platform 130. Preferably, the bases of the one or more electrode arrays 1 comprise orifices and are mechanically connected to the platform 130 by means of a mechanism such as for instance a clicking mechanism or by means of a biocompatible glue or polymer.

Preferably, the platform 130 is made out of a biocompatible material that is not dissolvable or resorbable by the body of a living human or other mammal. Suitable materials are well known to the person skilled in the art and comprise for instance Titanium, PMMA or silicone. Preferably, the platform 130 is not implanted into neural tissue but floats on top of the neural tissue.

As was already described above, in some embodiments of the invention, the platform may be used as a holder for storage and transportation of the electrode arrays.

Figure 10:
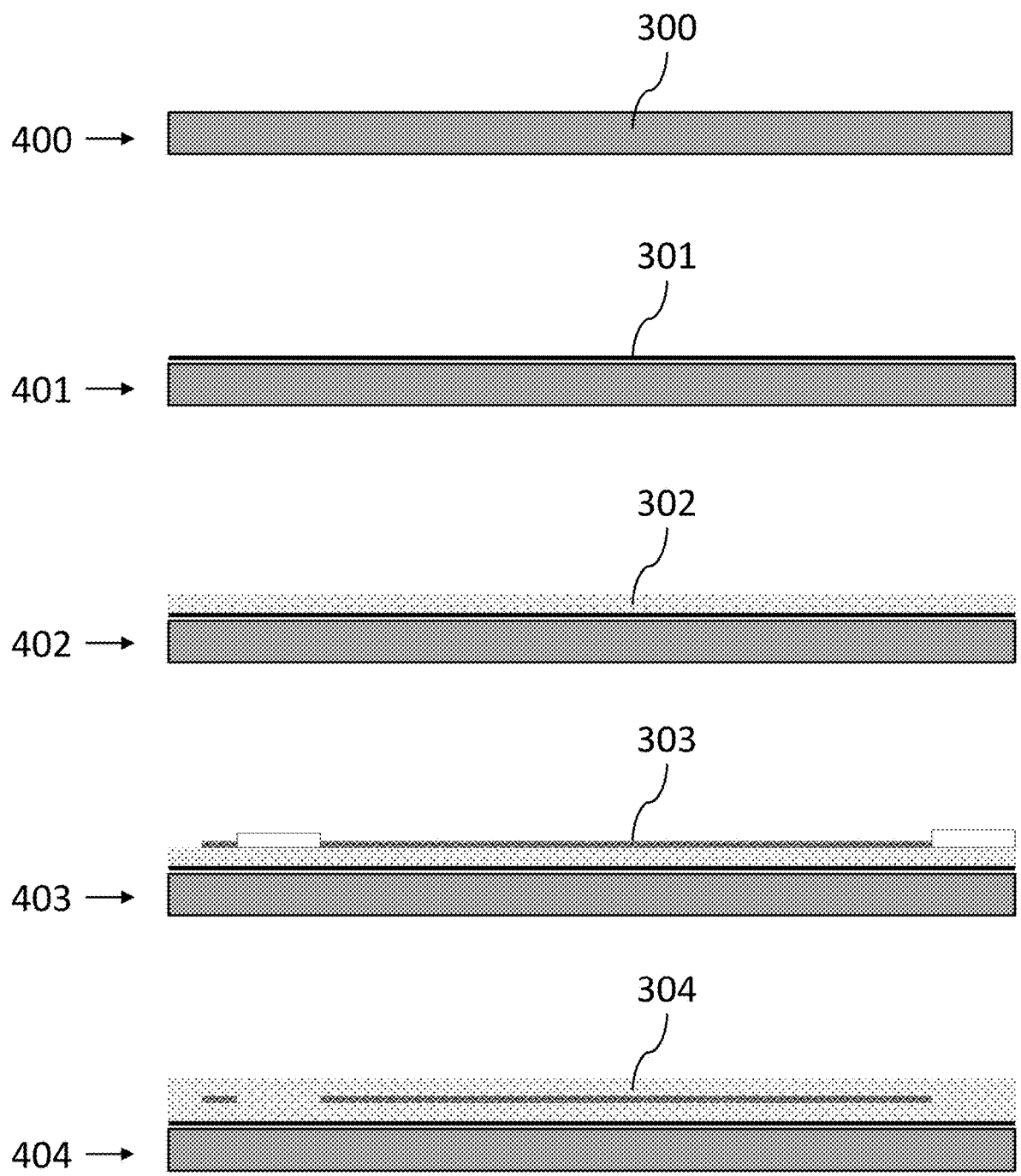
FIGS. 10(a) and (b) schematically illustrate the steps of a method of manufacturing the electrode array according to the present invention.
Figure 10:
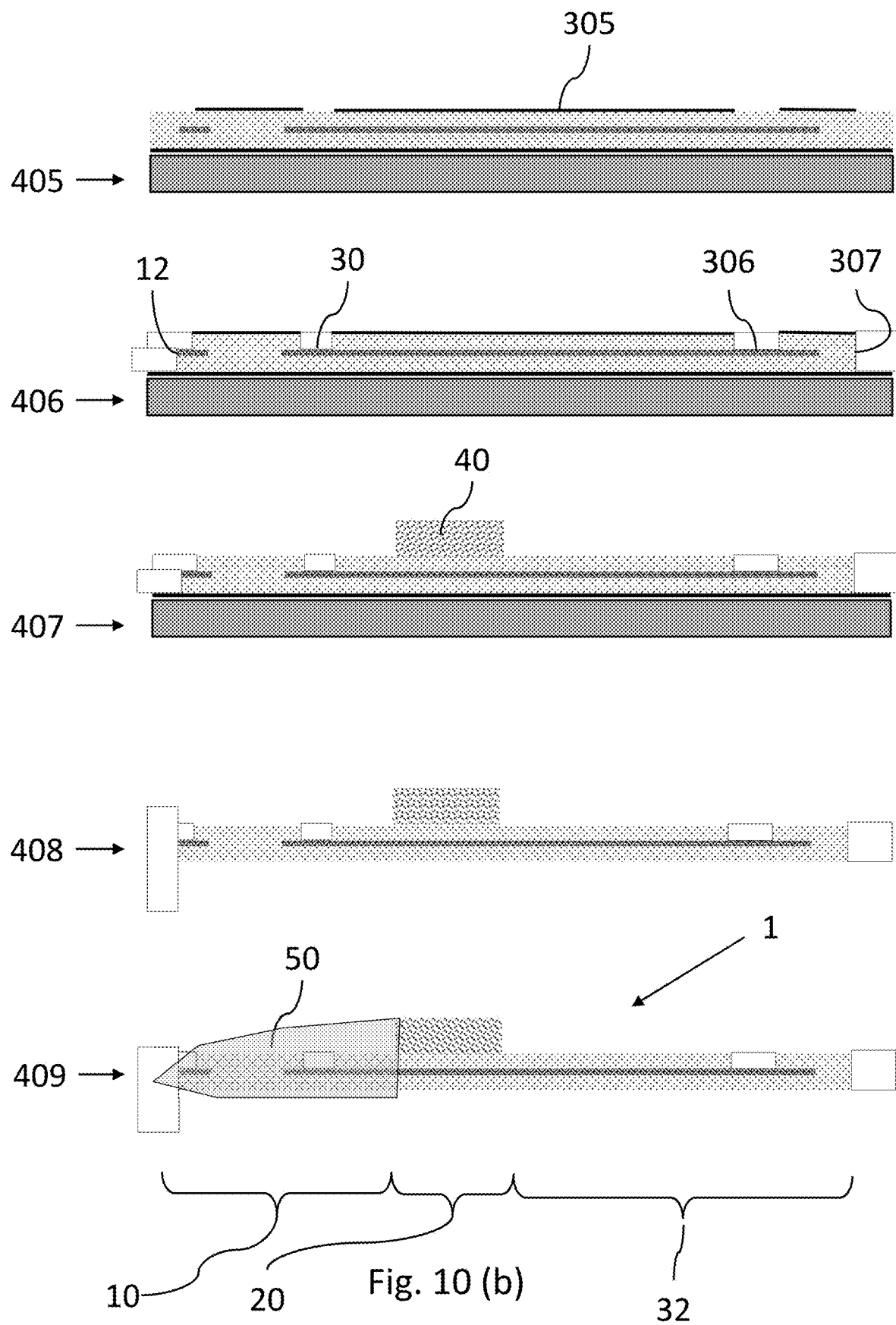

FIGS. 10(*a*) and (*b*) schematically illustrate the steps of a method of manufacturing the electrode array according to the present invention. In a first step 400 of the manufacturing method, a substrate 300 is provided. Preferably, this substrate 300 is a silicon wafer. In some embodiments—not shown in FIG. 10—this substrate is a (113) silicon wafer that is patterned using anisotropic wet etching in order to create a shallow mold in the substrate, that will improve the sharpness of the implants that will be built on top.

In step 401, a sacrificial layer 301 is applied to the substrate. This sacrificial layer serves the purpose of allowing the release of the electrode array from the substrate 300. The skilled person is aware of suitable materials for use as a sacrificial layer and of suitable methods for the application of a sacrificial layer. For instance, the sacrificial layer 301 can be deposited using sputter coating.

In step 402, a first layer of electrically insulating material 302 is deposited on top of the sacrificial layer 301. Preferably, the layer 302 is preferably made out of a flexible, bio-compatible and non-bioresorbable material. For instance, suitable materials for the realisation of layer 302 are polyimide or Parylene-C.

In step 403, an electrically conductive layer 303 is deposited on top of the electrically insulating layer 302. The conductive layer 303 is patterned to form the electrical traces 31 and electrode contacts 30 (not labelled in FIGS. 10 (*a*) and (*b*)) of the electrode array. The layer 303 is preferably made out of a biocompatible electrically conductive material such as platinum, gold, iridium oxide, carbon nanotubes or PEDOT.

In step 404, a second layer of electrically insulating material 304 is deposited on top of the electrical traces 31 and electrode contacts 30. Preferably, the layer 304 is preferably made out of a flexible, bio-compatible and non-bioresorbable material. For instance, suitable materials for the realisation of layer 304 are polyimide or Parylene-C. Preferably, the material of layer 304 is substantially identical to the material of layer 302. Preferably, the employed deposition process is such that layers 302 and 304 seamlessly blend into each other. Together, layers 302 and 304 form the flexible, electrically insulating backbone of the implant.

In step 405, an etch mask 305 is deposited on top of layer 304. Subsequently, the etch mask 305 is patterned.

In step 406, the electrically insulating layers 302 and 304 are etched, wherein both the electrically conductive layer 303 and the dedicated etch mask 305 play the role of etch mask. Since both layers 303 and 305 serve as etch mask, and since each of the layers 303 and 305 has been patterned individually, a single etch step can create several features. Preferably, in step 406, the electrode contacts 30 are defined on the shafts 10 of the electrode array by etching away the insulating layer 304 in the appropriate places. Preferably, the bondpads 306 for making the connection with the connector cable 32 (not shown in FIGS. 10 (a) and (b)) is created in the same way during step 406. Preferably, the outline 307 of the electrode array is defined in step 406 by etching away both layers 302 and 304. In some embodiments of the method, etching of the distal ends 12 of the shafts 10 of the electrode array increases the sharpness of the shafts 10, for instance through etching a staircase pattern in the distal ends 12.

In step 407, the first reinforcement layer 40 is applied over the base 20 and the proximal ends of the shafts 10.

In step 408, the partially coated electrode array is released from the substrate 300 by dissolution of the sacrificial layer 301.

In step 409, the second reinforcement layer 50 is applied using a dip-coating process to obtain an embodiment of the electrode array 1 according to the present invention.

Preferably, the connector cable 32 is manufactured as an integral part of the array such that the conductive core of the cable is continuous with the electrical traces and electrode contacts and the insulating mantle of the cable is continuous with the electrically insulating layers of the array.

The invention claimed is:

1. A substantially planar neural electrode array, said electrode array comprising:
a flexible base;
a connector cable, attached to said base;
one or more flexible shafts protruding from said base, said shafts arranged to protrude in the same plane from the same surface of said base so as to form a comb-like structure,
wherein each of said one or more shafts comprises one or more electrode contacts, said electrode contacts being electrically coupled to said connector cable;
wherein a first reinforcement layer extends over said base and a proximal part of said one or more shafts, said proximal part being adjacent to said base;
a second, resorbable or dissolvable reinforcement layer extends over a distal part of said one or more shafts, said distal part being distant from said base;
wherein there is overlap between said first reinforcement layer and said second resorbable reinforcement layer.

2. The electrode array according to claim 1, wherein said proximal part has a length greater than or equal to 50 microns and smaller than or equal to 500 microns.

3. The electrode array according to claim 1, wherein the distal tips of said shafts have a tip angle inferior to 45°.

4. The electrode array according to claim 1, wherein said base comprises one or more orifices.

5. The electrode array according to claim 1, wherein said connector cable is a split multi-core meandering cable.

6. A neural implant, said implant comprising:
one or more neural electrode arrays according to claim 1;
an electronics unit;
wherein the connector cables of said one or more electrode arrays are electrically connected to said electronics unit.

7. The implant according to claim 6, wherein the bases of said one or more electrode arrays are connected by means of a platform.

8. The implant according to claim 7, wherein said platform is created in situ.

9. The implant according to claim 6, wherein said one or more electrode arrays are stored on a detachable holder, wherein said holder separates said one or more electrode arrays from each other.

10. A method for the fabrication of a neural electrode array according to claim 1, said method comprising the steps of:
providing a planar substrate coating said substrate with a sacrificial layer;
depositing at least a first layer of electrically insulating material on said sacrificial layer;
depositing one or more metal traces and electrode contacts on said first layer;
depositing at least a second layer of electrically insulating material on said first layer and said metal traces;
applying the first reinforcement layer;
applying the second, resorbable reinforcement layer.

11. The method according to claim 10, wherein said first reinforcement layer is applied using a first dip coating process and said second reinforcement layer is applied using a second dip coating process.

12. The method according to claim 10, wherein said first reinforcement layer is applied using a molding process and said second reinforcement layer is applied using a dip coating process.

13. The method according to claim 10, wherein said first reinforcement layer is applied using a deposition process and said second reinforcement layer is applied using a dip coating process.

14. The method according to claim 10, wherein said first reinforcement layer is fabricated separately from an uncoated electrode array;
wherein said first reinforcement layer is attached to said uncoated electrode array and
wherein said second reinforcement layer is applied using a dip coating process.

15. The method according to claim 10, wherein the planar substrate is a single-crystal silicon wafer,
wherein the crystal planes of said wafer are inclined at a substantially sharp angle to the surface of said wafer and
wherein said surface is patterned and etched anisotropically to create a mold for said neural electrode array in said wafer.

* * * * *